US007633098B2

(12) United States Patent
Yang et al.

(10) Patent No.: US 7,633,098 B2
(45) Date of Patent: Dec. 15, 2009

(54) FIELD-EFFECT-TRANSISTOR MULTIPLEXING/DEMULTIPLEXING ARCHITECTURES

(75) Inventors: Xiaofeng Yang, Corvallis, OR (US); Pavel Komilovich, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/765,374

(22) Filed: Jun. 19, 2007

(65) Prior Publication Data

US 2007/0241413 A1   Oct. 18, 2007

Related U.S. Application Data

(62) Division of application No. 10/835,659, filed on Apr. 30, 2004, now Pat. No. 7,247,531.

(51) Int. Cl.
    *H01L 27/10* (2006.01)
(52) U.S. Cl. .................... 257/202; 257/205; 257/206; 365/163; 365/185.05
(58) Field of Classification Search ............ 257/202, 257/205, 206; 365/163, 185.05
    See application file for complete search history.

(56) References Cited

U.S. PATENT DOCUMENTS

| | | | |
|---|---|---|---|
| 2,744,970 A | 5/1956 | Shockley | |
| 2,939,057 A | 5/1960 | Tezner | |
| 3,964,296 A | 6/1976 | Matzuk | |
| 4,097,314 A | 6/1978 | Schlesier et al. | |
| 4,240,845 A | 12/1980 | Esch et al. | |
| 5,008,616 A | 4/1991 | Lauks et al. | |
| 5,105,245 A | 4/1992 | Riemenschneider et al. | |
| 5,118,801 A | 6/1992 | Lizardi et al. | |
| 5,132,278 A | 7/1992 | Stevens et al. | |
| 5,202,290 A | 4/1993 | Moskovits | |
| 5,237,523 A | 8/1993 | Bonne et al. | |
| 5,317,541 A | 5/1994 | Chan | |
| 5,330,612 A | 7/1994 | Watanabe | |
| 5,376,755 A | 12/1994 | Negm et al. | |
| 5,418,558 A | 5/1995 | Hock et al. | |
| 5,493,167 A | 2/1996 | Mikol et al. | |
| 5,591,896 A | 1/1997 | Lin | |
| 5,622,825 A | 4/1997 | Law et al. | |
| 5,747,180 A | 5/1998 | Miller et al. | |
| 5,767,521 A | 6/1998 | Takeno et al. | |
| 5,772,905 A | 6/1998 | Chou | |
| 5,780,710 A | 7/1998 | Murase et al. | |
| 5,801,124 A | 9/1998 | Gamble et al. | |
| 5,837,454 A | 11/1998 | Cozzette et al. | |
| 5,837,466 A | 11/1998 | Lane et al. | |
| 5,843,653 A | 12/1998 | Gold et al. | |

(Continued)

OTHER PUBLICATIONS

Choi, et al.; "Sublighographic nanofabrication technology for nanocatalysts and DNA Chips"; J. Vac. Sci. Technol. B21(6) Nov./Dec. 2003; pp. 2951-2955.

(Continued)

*Primary Examiner*—Phuc T Dang

(57) ABSTRACT

This disclosure relates to field-effect-transistor (FET) multiplexing/demultiplexing architectures and methods for fabricating them. One of these FET multiplexing/demultiplexing architectures enables decoding of an array of tightly pitched conductive structures. Another enables efficient decoding of various types of conductive-structure arrays, tightly pitched or otherwise. Also, processes for forming FET multiplexing/demultiplexing architectures are disclosed that use alignment-independent processing steps. One of these processes uses one, low-accuracy imprinting step and further alignment-independent processing steps.

9 Claims, 17 Drawing Sheets

U.S. PATENT DOCUMENTS

| | | | |
|---|---|---|---|
| 5,869,244 | A | 2/1999 | Martin et al. |
| 5,918,110 | A | 6/1999 | Abraham-Fuchs et al. |
| 5,972,710 | A | 10/1999 | Weigl et al. |
| 5,997,958 | A | 12/1999 | Sato et al. |
| 6,028,013 | A | 2/2000 | Annapragada et al. |
| 6,034,389 | A | 3/2000 | Burns, Jr. et al. |
| 6,120,844 | A | 9/2000 | Chen et al. |
| 6,150,097 | A | 11/2000 | Tyagi et al. |
| 6,150,106 | A | 11/2000 | Martin et al. |
| 6,231,744 | B1 | 5/2001 | Ying et al. |
| 6,238,085 | B1 | 5/2001 | Higashi et al. |
| 6,243,283 | B1 * | 6/2001 | Bertin et al. ............ 365/63 |
| 6,256,767 | B1 | 7/2001 | Kuekes et al. |
| 6,284,979 | B1 | 9/2001 | Malozemoff et al. |
| 6,294,450 | B1 | 9/2001 | Chen et al. |
| 6,355,436 | B1 | 3/2002 | Martin et al. |
| 6,359,288 | B1 | 3/2002 | Ying et al. |
| 6,360,582 | B1 | 3/2002 | Chelvayohan et al. |
| 6,365,059 | B1 | 4/2002 | Pechenik |
| 6,407,443 | B2 | 6/2002 | Chen et al. |
| 6,438,501 | B1 | 8/2002 | Szecsody et al. |
| 6,463,124 | B1 | 10/2002 | Weisman |
| 6,482,639 | B2 | 11/2002 | Snow et al. |
| 6,521,109 | B1 | 2/2003 | Bartic et al. |
| 6,562,577 | B2 | 5/2003 | Martin et al. |
| 6,643,491 | B2 | 11/2003 | Kinouchi et al. |
| 6,680,377 | B1 | 1/2004 | Stanton et al. |
| 6,694,800 | B2 | 2/2004 | Weckstrom et al. |
| 6,712,666 | B2 | 3/2004 | Wu |
| 6,747,180 | B2 | 6/2004 | Ostgard et al. |
| 2001/0033585 | A1 | 10/2001 | Lazarus et al. |
| 2001/0046674 | A1 | 11/2001 | Ellington |
| 2002/0012937 | A1 | 1/2002 | Tender et al. |
| 2002/0061536 | A1 | 5/2002 | Martin et al. |
| 2002/0117659 | A1 | 8/2002 | Lieber et al. |
| 2002/0130353 | A1 | 9/2002 | Lieber et al. |
| 2003/0089899 | A1 | 5/2003 | Lieber et al. |
| 2003/0132461 | A1 | 7/2003 | Roesner et al. |
| 2003/0148562 | A1 | 8/2003 | Luyken et al. |
| 2003/0161205 | A1 * | 8/2003 | Chevallier ............ 365/201 |
| 2003/0162190 | A1 | 8/2003 | Gorenstein et al. |
| 2003/0170650 | A1 | 9/2003 | Karube et al. |
| 2003/0186522 | A1 | 10/2003 | Duan et al. |
| 2003/0189202 | A1 | 10/2003 | Li et al. |
| 2003/0219801 | A1 | 11/2003 | Lipshutz |
| 2003/0224435 | A1 | 12/2003 | Seiwert |
| 2004/0005723 | A1 | 1/2004 | Empedocles et al. |
| 2004/0005923 | A1 | 1/2004 | Allard et al. |
| 2004/0007740 | A1 | 1/2004 | Abstreiter et al. |
| 2004/0009510 | A1 | 1/2004 | Seiwert et al. |
| 2004/0028936 | A1 | 2/2004 | Kogiso et al. |
| 2004/0031975 | A1 | 2/2004 | Kern et al. |
| 2004/0043527 | A1 | 3/2004 | Bradley et al. |
| 2004/0245544 | A1 | 12/2004 | Fricke et al. |

OTHER PUBLICATIONS

Coleman, et al.; "Percolation-dominated conductivity in a conjugated-polymer-carbon composite" Rapid communications Physical Review B; vol. 58; No. 12; Sep. 15, 1998, The American Physical Society; pp. RR7492-R7495.

Melosh et al.; "Ultrahigh-Density Nanowire Lattices and Circuits" California Nanosystems Institute University of California Sciencexpress Report, 2003.

Covington, et al., "A polymer gate FET sensor array for detecting organic vapours," Sensors and Actuators B 77 Elsevier Science 2001, pp. 155-162.

* cited by examiner

US 7,633,098 B2

FIELD-EFFECT-TRANSISTOR MULTIPLEXING/DEMULTIPLEXING ARCHITECTURES

RELATED APPLICATION

This Application is a divisional of U.S. patent application Ser. No. 10/835,659, filed Apr. 30, 2004, now U.S. Pat. No. 7,247,531, herein incorporated by reference in its entirety. U.S. patent application having Ser. No. 10/453,329, a filing date of Jun. 2, 2003, for MULTILEVEL IMPRINT LITHOGRAPHY of Kornilovich, et al is related to this application.

TECHNICAL FIELD

This invention relates to field-effect-transistor multiplexing/demultiplexing architectures and methods of forming the same.

BACKGROUND

Electrical communication in and out of an array of tightly pitched wires can be difficult. It can be difficult because aligning an electrical bond pad to each wire without accidentally connecting to an adjacent wire can require a machine capable of high accuracy.

One structure for electrically connecting to wires of an array is called a multiplexing/demultiplexing architecture (a "mux/demux architecture"). The mux/demux architecture does not need an electrical bond pad to be connected or aligned with each wire of an array. Instead, one bond pad is typically connected to all of the wires of the array.

This one bond pad, however, does not allow communication with each wire of the array individually. To differentiate between wires, an address element, such as a transistor, can be contacted with each of the wires. For a 16-wire array, for instance, four transistors can be contacted with each wire. By selectively turning the transistors on and off, only one of the 16 wires can be permitted to communicate with the one bond pad. Manufacturing this mux/demux architecture is typically less expensive and more reliable than connecting a bond pad to each wire.

In FIG. 1, for instance, an array of wires 102 with a pitch 103 of about 1000 nanometers is electrically connected to one common node 104. A pitch is a distance between wires plus a width of one of those wires. Thus, a pitch of an array having wires that are one millimeter wide and spaced two millimeters apart is three millimeters. Wires 106 of the array 102 can be communicated with separately using a mux/demux architecture shown at numeral 108. This mux/demux 108 has four different address circuits 110, 112, 114, and 116, each of which communicates with a set of transistors 118 through two address lines. These address circuits can turn on or off the transistors 118 to which they are connected. By turning the transistors 118 on and off, only one of the wires 106 will have the same voltage as the voltage supply 120, while the rest of the wires 106 will have no voltage. Thus, only one of the wires 106 can be selected and therefore have the same voltage as the voltage supply 120.

For example, a third wire 122 can be selected if all four of the transistors 118 that are in contact with the third wire 122 are turned on. The transistors 118 of the third wire 122 are turned on by turning the address circuit 110 on, the circuit 112 on, the circuit 114 off, and the circuit 116 on. When on, the transistors 118 on the "Logical YES" side of each of the address circuits turn on and on the "Logical NOT" side turn off, and vice-versa. Address wires 124, 126, 128, and 130 are used to turn the address circuits 110, 112, 114, and 116 on or off, respectively.

One problem with this mux/demux architecture 108 is that it uses address elements (like transistors, diodes, and resistors) that typically need to be aligned with the wires during fabrication. Aligning these elements with the wires can be accomplished with typical processing machines if the wires of the array have a large enough pitch 103. For smaller pitches, however, the address elements of the mux/demux architecture 108 may not be alignable with wires of the array.

There is, therefore, a need for small-pitched devices and methods for addressing them electrically.

BRIEF DESCRIPTION OF THE DRAWINGS

The same numbers are used throughout the disclosure and figures to reference like components and features.

DETAILED DESCRIPTION

Overview

This application discloses field-effect-transistor (FET) multiplexing/demultiplexing (mux/demux) architectures and methods for forming them. One of these mux/demux architectures enables decoding of an array of tightly pitched conductive structures. Another enables efficient decoding of various types of conductive-structure arrays, tightly pitched or otherwise.

Also, processes for forming FET mux/demux architectures are disclosed that, in some instances, use alignment-independent processing steps. One of these processes uses one, low-accuracy processing step and further alignment-independent processing steps. By not relying on accurate alignment steps, this process may be less expensive and/or more production-friendly than processes that rely on them.

Imprinting

Figure 1:
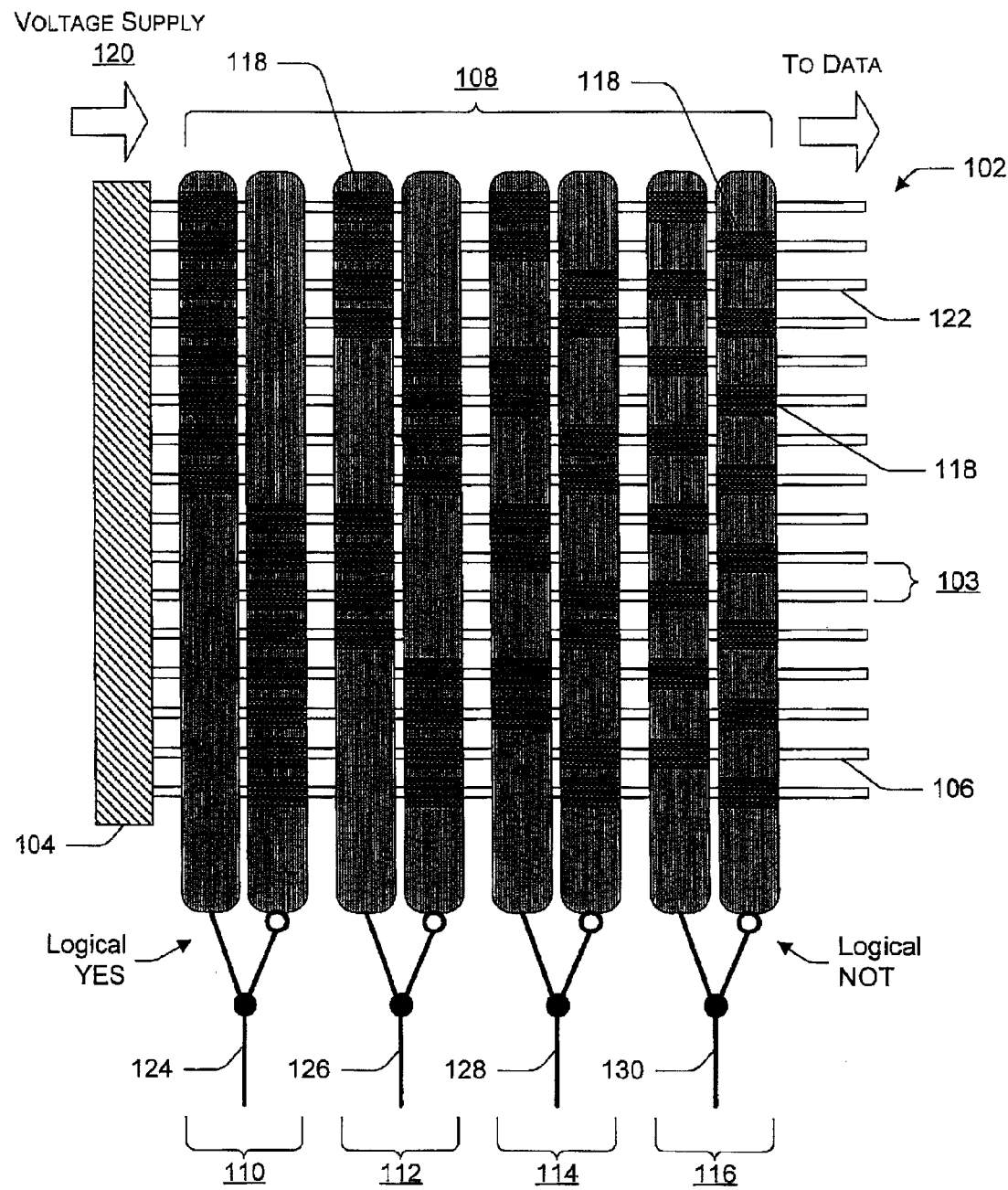
FIG. 1 is a top plan view of a prior-art mux/demux architecture, and is discussed in the "Background" section above.
Figure 2:
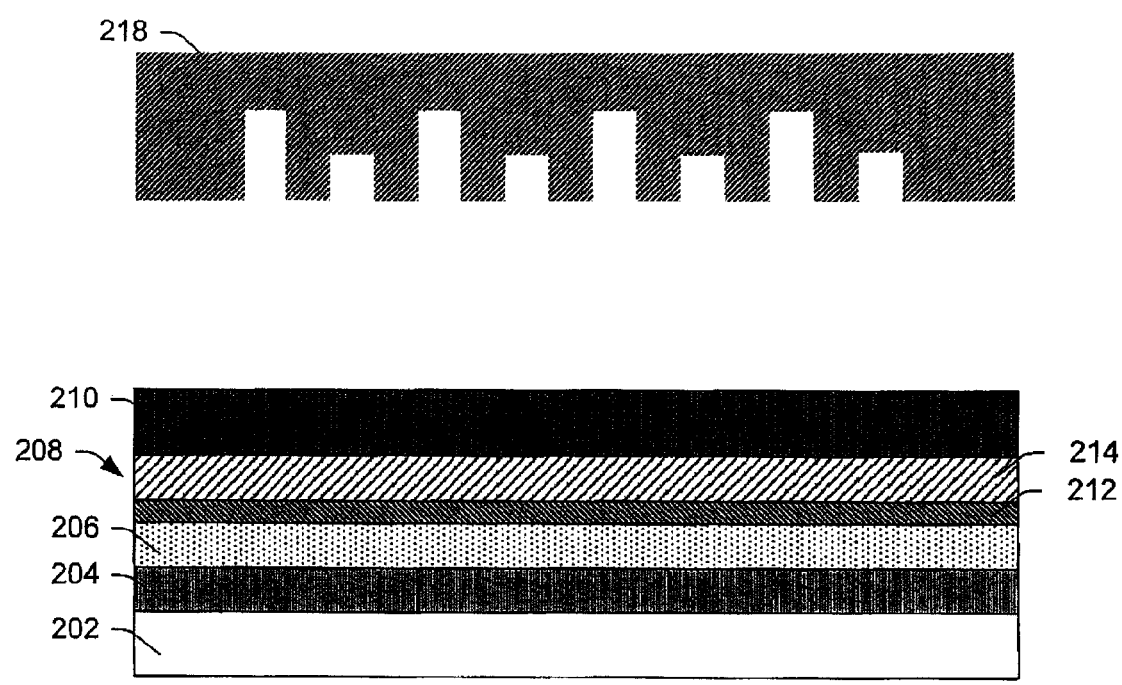
FIG. 2 includes a cross-section of a substrate over which various layers of materials are formed and a mold.

Referring initially to FIG. 2, various layers of material are formed over a substrate 202. A first dielectric layer 204 is formed over the substrate 202 and comprises a material such silicon oxide. Of course, other dielectric materials can be used. A layer 206 is formed over the substrate 202 and comprises, in this example, a semi-conductive precursor material such as undoped silicon or a semi-conductive material, such as silicon doped up to about $10^{17}$ $cm^{-3}$. Over layers 204 and 206, a second dielectric layer 208 can be formed and comprises one or more dielectric materials, such as silicon oxide and/or tantalum oxide. In other embodiments discussed below, the second dielectric layer 208 is not formed. An imprintable layer 210 is formed over the substrate 202, and comprises a material such as silicon.

In one embodiment, the second dielectric layer 208 comprises two materials having different dielectric constants. For example, layer 208 can comprise a high-k dielectric layer 212 and a low-k dielectric layer 214. The high-k dielectric layer 212 can comprise a dielectric material having a higher dielectric constant than the low-k dielectric layer 214, such as tantalum oxide or hafnium oxide. The low-k dielectric layer 214 can comprise silicon dioxide, for instance.

In the ongoing embodiment shown in FIG. 2, the first dielectric layer 204 is about 200 nanometers thick, the semi-conductive layer 206 about twenty nanometers thick, the second dielectric layer 208 about fifty nanometers thick (the high-k dielectric layer 212 being from about one to five nanometers of this thickness, if present), and the imprintable layer 210 about thirty nanometers thick.

An imprinting mold 218 is also set forth in FIG. 2 and is capable of imprinting the imprintable layer 210 by mechanically pressing the imprintable layer 210.

Figure 3:
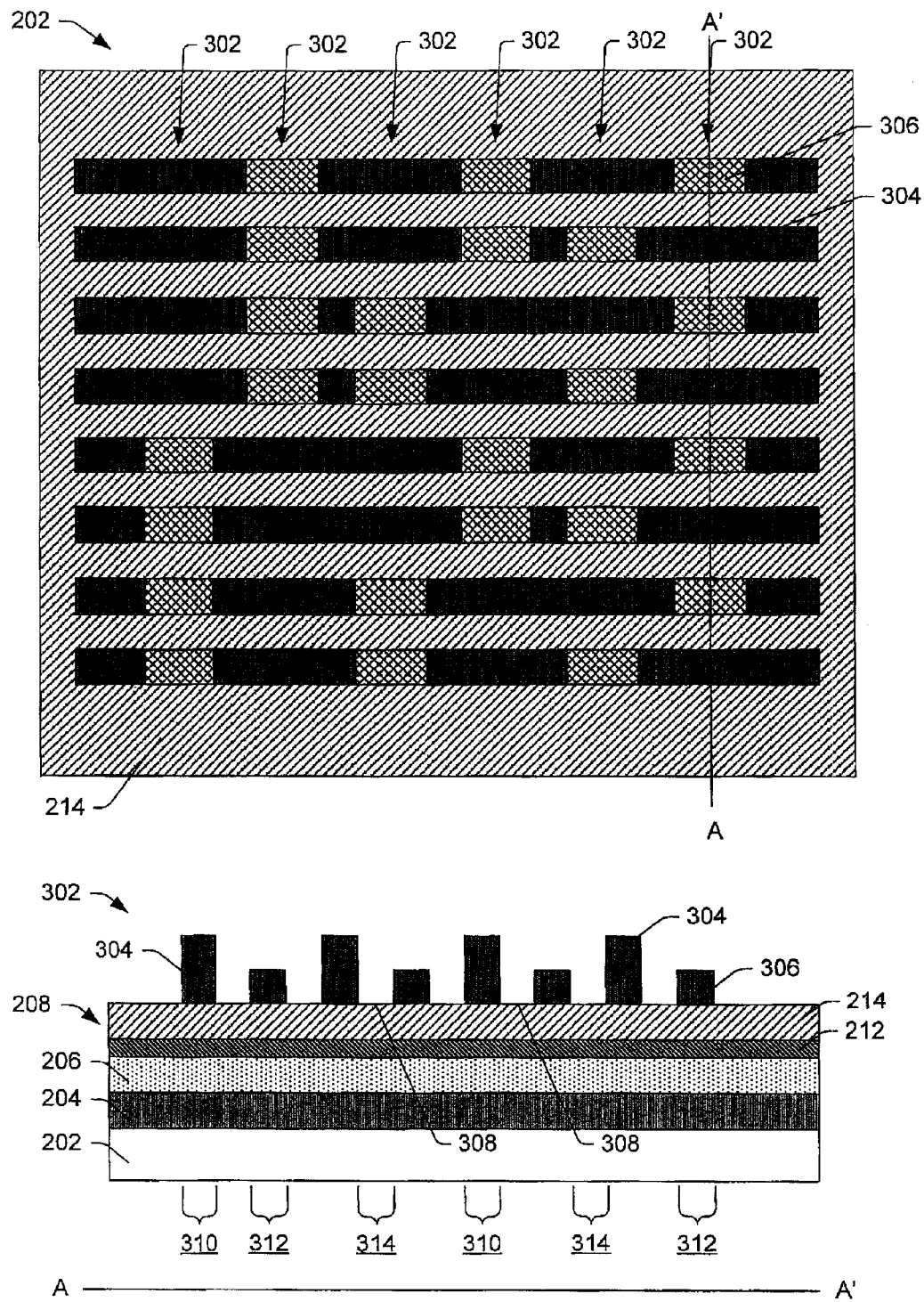
FIG. 3 includes the cross-section of the substrate of FIG. 2 at a processing step subsequent to that shown in FIG. 2 and a top-plan view of the substrate over which elongate rows of different thicknesses are formed.

Referring to FIG. 3, elongate rows 302 of structures having differing thickness are formed. In the ongoing embodiment, the mold 218 is pressed once on the imprintable layer 210 to form the rows 302 and structures between them. In this embodiment the rows 302 have an elongate dimension and a cross-section along that dimension showing the multiple-thickness structures as tiers of different thicknesses. In the illustrated example a first tier 304, a second tier 306, and a third tier 308 are formed. Each of the tiers 304, 306, and 308 also defines a region beneath the tiers. In the illustrated example, a first region 310, a second region 312 and a third region 314, are respectively defined. The first tier 304 and the second tier 306 have thicknesses from between about five to one hundred nanometers. In the illustrated example, the first tier 304 is about twenty to three hundred percent thicker than the second tier 306. The third tier 308 may have little or no thickness, such as from zero to five nanometers.

The top-plan view shows the unique cross-sections of elongate rows 302. These rows 302 can be formed with one imprinting step with the mold 218 being a three-dimensional negative of the elongate rows 302. In the top-plan view, the first tiers 304 are shown with the same fill-pattern as shown in the cross-section along lines A-A'. The second tiers 306, however, are shown with a different fill-pattern (a diagonal cross-hatch) to aid the reader in visualizing the structure.

In at least one embodiment, rows 302 can be formed with a process that utilizes or requires very little alignment accuracy. In the ongoing embodiment, for instance, the mold 218 can be pressed on the imprintable layer 210 without regard to an existing structure (other than the size of the substrate 202) with which the rows 302 must be aligned. By making the substrate 202 sufficiently large, the rows 302 can be formed with a low-accuracy machine. If the substrate 202 is ten centimeters square, for instance, and the mold 218 is ¹/₁₀ of one centimeter square, the mold 218 can be pressed on the imprintable layer 210 with a machine capable of about plus or minus five centimeters tolerance. Thus, the rows 302 can be formed with little regard to alignment.

Alignment-Independent Techniques

Figure 4:
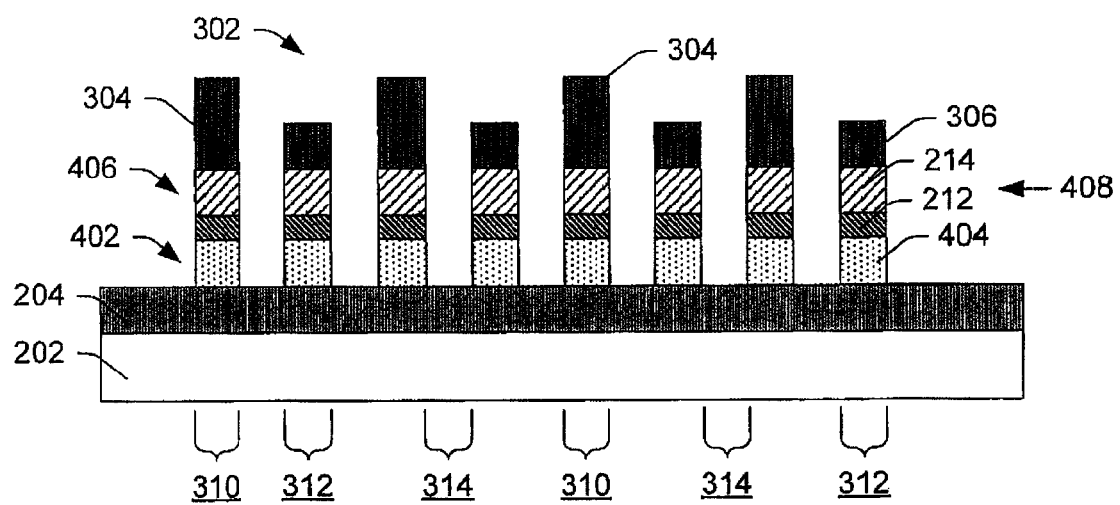
FIG. 4 includes the view of the cross-section of the substrate of FIG. 3 at a processing step subsequent to that shown in FIG. 3.

Referring to FIG. 4, an array of conductive structures 402 is formed with etching or another suitable alignment-independent technique. The array 402 can be formed by removing parts of the semi-conductive layer 206 in regions defined by the differing thicknesses of the elongate rows 302.

In the ongoing embodiment, the array 402 is formed in the regions 312 and 310 by removing parts of the semi-conductive layer 206 in the third regions 314. By so doing, the array 402 of the conductive structures 404 in this embodiment is formed having a pitch of less than or about ninety nanometers. The array 402 is shown in cross-section perpendicular to an elongate dimension of conductive structures 404 of the array 402. Also in this embodiment, the conductive structures 404 comprise material from the semi-conductive layer 206. Other embodiments where the conductive structures 404 also comprise highly conductive materials are discussed in greater detail following FIG. 8.

Semi-Conductive, Conductive-Structure Arrays

In the ongoing embodiment, an array of dielectric structures 406 is also formed, either as part of the alignment-independent technique for forming the array 402 or with a separate alignment-independent technique. The array 406 of dielectric structures 408, in this embodiment, are in physical contact with and mirror the arrangement of the array 402 of the conductive structures 404.

Also in the ongoing embodiment, the third regions 314 of the dielectric layer 208 and the semi-conductive layer 206 are removed, while the first and second regions 310 and 312 are not removed because they are protected by the first and second tiers 304 and 306 of the rows 302.

Figure 5:
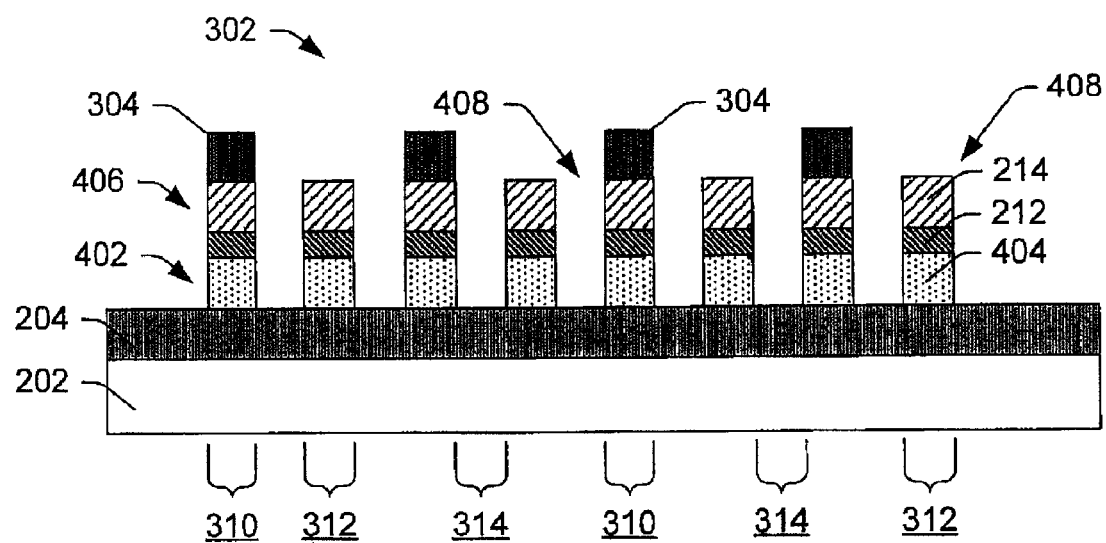
FIG. 5 includes the view of FIG. 4 at a processing step subsequent to that shown by FIG. 4.

Referring to FIG. 5, some of the thickness of the rows 302 is removed through time-etching or another suitable alignment-independent technique.

In the ongoing embodiment, the first tiers 304 are made thinner and the second tiers 306 are removed, exposing tops of some of the dielectric structures 408 in the second regions 312.

Figure 6:
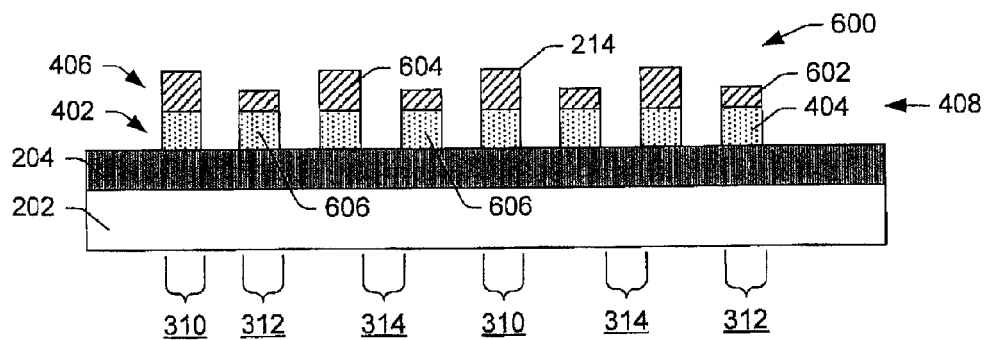
FIG. 6 include the view of FIG. 5 and an additional cross-section, both at a processing step subsequent to that shown by FIG. 5, and a substrate having a differentiated dielectric layer without a high-dielectric-constant material.
Figure 6:
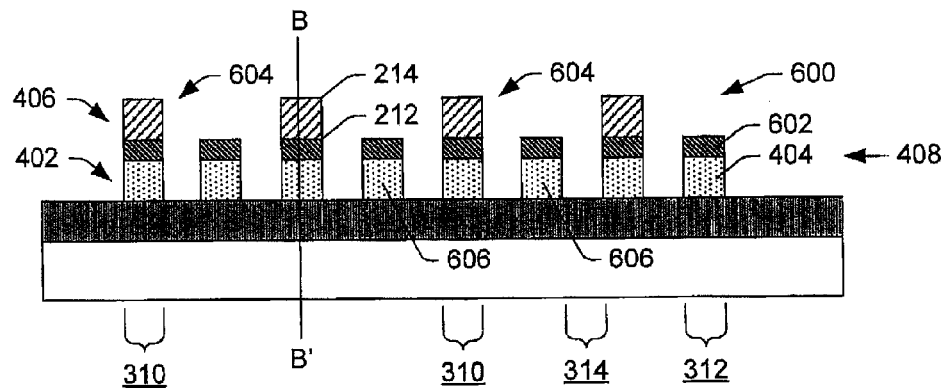
Figure 6:
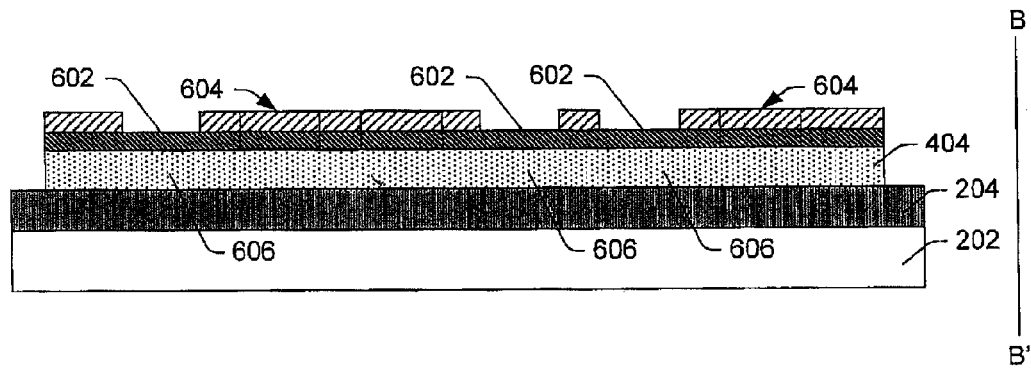

Referring to FIG. 6, differing-thickness dielectric structures 600 are formed over the array 402. These differing-thickness dielectric structures 600 can be formed by differentiating the dielectric structures 408 of the array 406, such as by altering a thickness of some or all of the dielectric structures. By so doing, some of the dielectric structures (shown as gates 602) are formed capable of acting as gates for FETs with appropriate threshold voltage, while others (shown as non-gates 604) are either not capable of acting as gates or, the resulting threshold voltage is out of operating range. In the ongoing embodiment, the gates 602 are from between about two to ten nanometers thick and the non-gates are from between about ten to one hundred nanometers thick. Some of the dielectric structures 408 of the array 406 can be made thinner to differentiate them through time-etching or another alignment-independent technique. As part of this technique, the first tiers 304 may also be removed, or with a separate suitable technique, both of which can be alignment-independent.

In the ongoing embodiment where the dielectric layer 208 comprises the high-k dielectric layer 212 and the low-k dielectric layer 214, the low-k dielectric material 214 can be removed, thereby differentiating the dielectric structures 408 into the gates 602 and the non-gates 604. Though the non-gates 604 may comprise both the high-k dielectric layer 212 and the low-k dielectric layer 214, the low-k dielectric layer 214 will have a dominant effect on gate electrical capacitance, thereby keeping the non-gates 604 effectively at a low dielectric constant.

In another embodiment where the dielectric layer 208 comprises the low-k dielectric layer 214 and not the high-k dielectric layer 212 (also shown in FIG. 6), the differing thicknesses of the dielectric structures 408 differentiates the dielectric structures of the array 406 in the gates 602 and the non-gates 604.

Referring also to FIG. 6, a cross-section along an elongate dimension of one of the conductive structures 404 is shown (along line B-B'). This cross-section shows the gates 602 and the non-gates 604 over an exemplary conductive structure 404, and regions 606 near the gates 602.

In one embodiment, a conductivity of the conductive structures 404 at the regions 606 is altered through implantation or another suitable alignment-independent technique. The polarity of these regions 606 is altered so that the conductive structures 404 are not conductive at these regions 606. The polarity at regions near the non-gates 604 is not altered because of the additional thickness of the non-gates 604 or due to comprising different materials than the gates 602. The gates 602, if appropriately charged, can be used to invert the polarity at these regions 606, thereby permitting measurable current to pass through the conductive structure 404. In the ongoing embodiment, however, the gates 602 can be used to reduce the conductivity at the regions 606 if their polarity is not altered.

Figure 7:
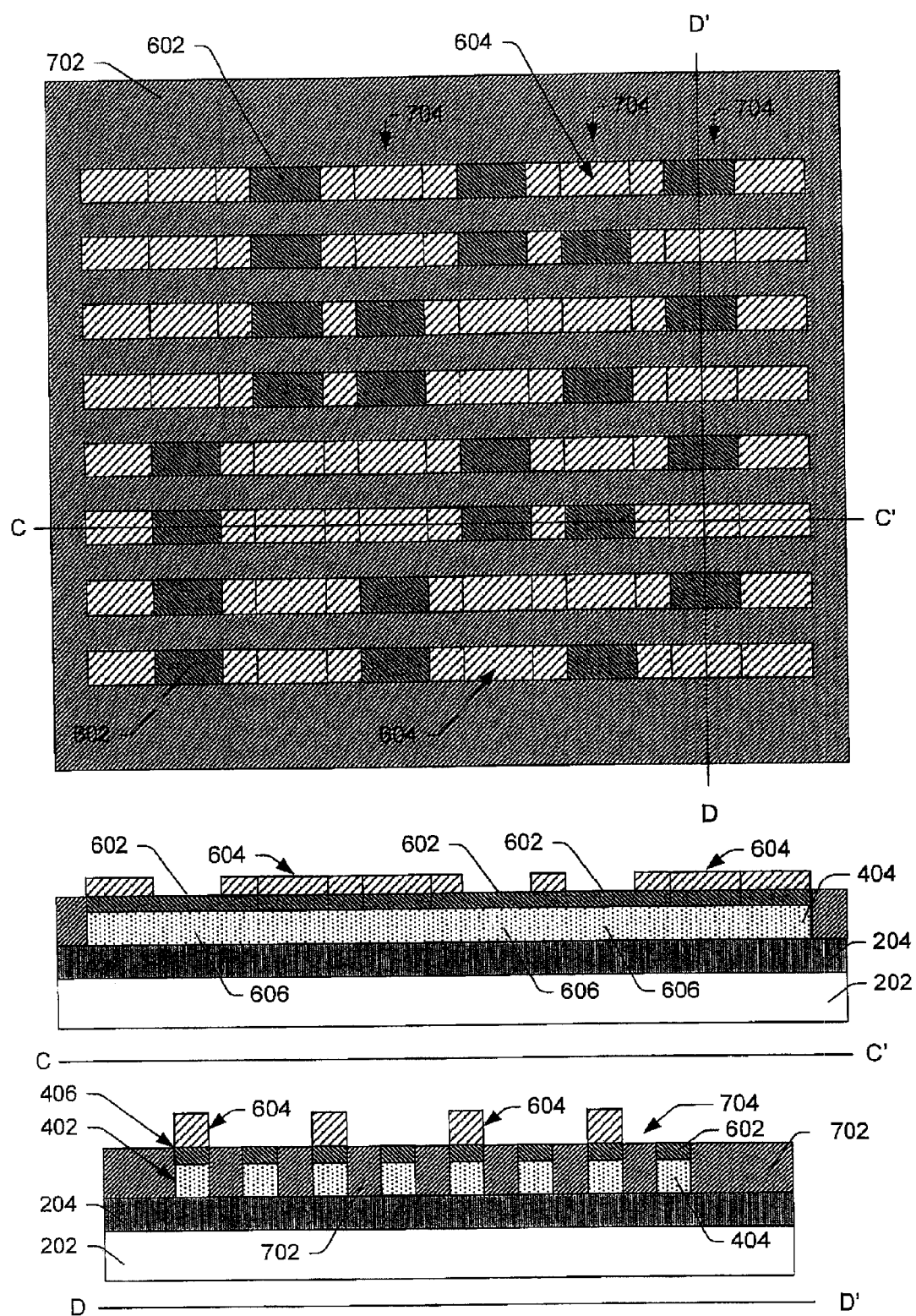
FIG. 7 includes two of the views of FIG. 6 at a processing step subsequent to that shown by FIG. 6 and a corresponding top-plan view.

Referring to FIG. 7, a passivation layer 702 is formed between the conductive structures 404 using chemical vapor deposition, spin coating, or other suitable alignment-independent techniques. This passivation layer 702 is shown in a top-plan view of the dielectric-structure array 406 with the gates 602 and non-gates 604. The array 406 comprises elongate rows 704 of gates 602 and non-gates 604 oriented at a non-zero angle relative to the elongate dimension of the conductive structures 404 (here about ninety degrees). Each of these rows 704 can have a unique arrangement of the gates 602 and the non-gates 604 along the elongate dimension. One of these rows 704 is shown in cross-section along a line D-D', with the conductive structures 404 separated by the passivation layer 702. A cross-section along an elongate dimension of one of the conductive structures 404 is also shown (line C-C').

Addressing the FET Gates

Figure 8:
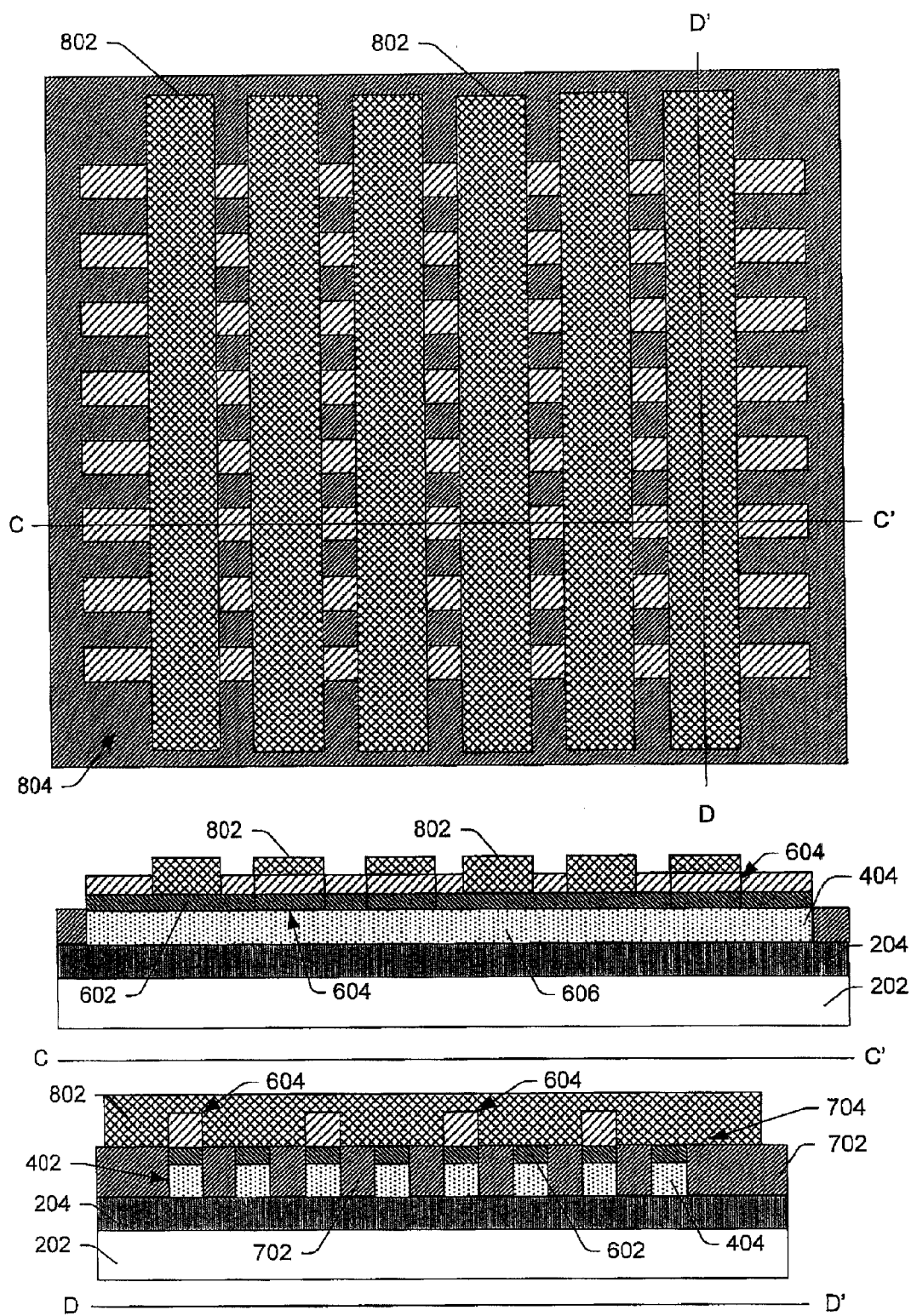
FIG. 8 includes the views of FIG. 7 at a processing step subsequent to that shown by FIG. 7.

Referring to FIG. 8, address lines 802 are formed over the gates 602 using photolithography or other suitable techniques. The address lines 802 can communicate with the array 402 of conductive structures 404 through the gates 602. These address lines 802 and the gates 602 form a FET mux/demux architecture 804 permitting FET-based communication with the array 402.

In one embodiment, the address lines 802 are formed substantially co-parallel with the elongate rows 704 and over the gates 602 and the non-gates 604.

Conductive Structures with Semi-Conductive and Highly Conductive Regions

Figure 9:
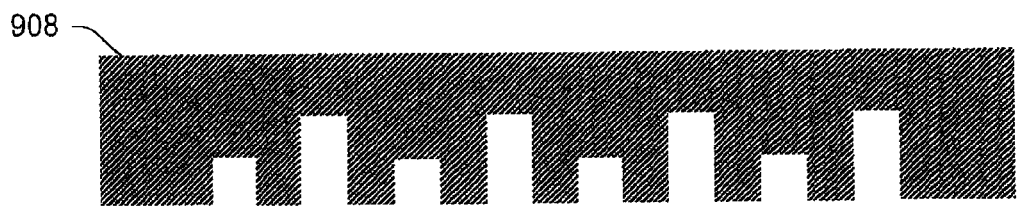
FIG. 9 includes cross-sections of first and second substrate systems having various layers of materials, and two molds.
Figure 9:
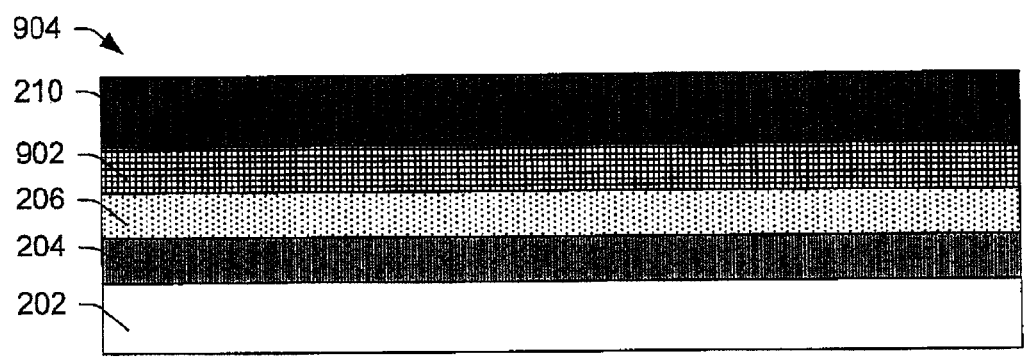
Figure 9:
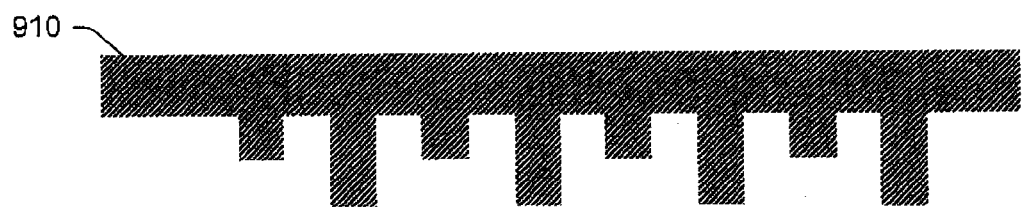
Figure 9:
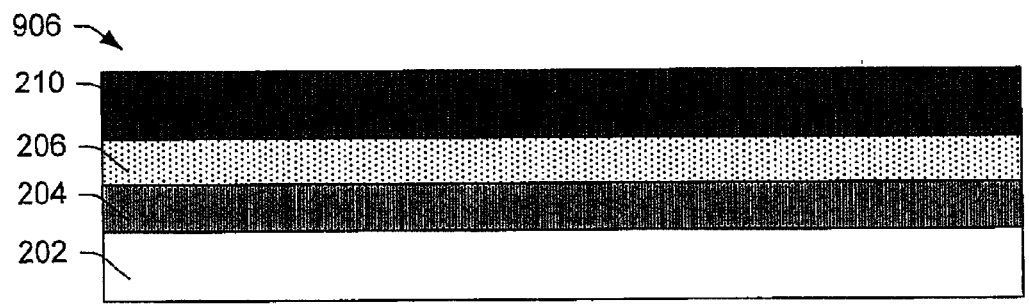

Referring to FIG. 9, a highly conductive layer 902 is formed over the substrate 202 having the first dielectric layer 204 and the semi-conductive layer 206. The highly conductive layer 902 can comprise one or more highly conductive materials, such as aluminum or gold. The imprintable layer 210 is also formed over the substrate 202.

Two examples of the substrate 202 and its layers (marked first substrate system 904 with the highly conductive layer 902 and second substrate system 906 without the highly conductive layer 902) are shown. The highly conductive layer 902 comprises aluminum and is about ten nanometers thick in this embodiment. As set forth below, each of these systems can be processed with further alignment-independent techniques to form conductive structures having semi-conductive and highly conductive regions that are capable of being addressed using FETs.

Two imprinting molds 908 and 910 are also set forth in FIG. 9 and are capable of imprinting the imprintable layer 210.

Figure 10:
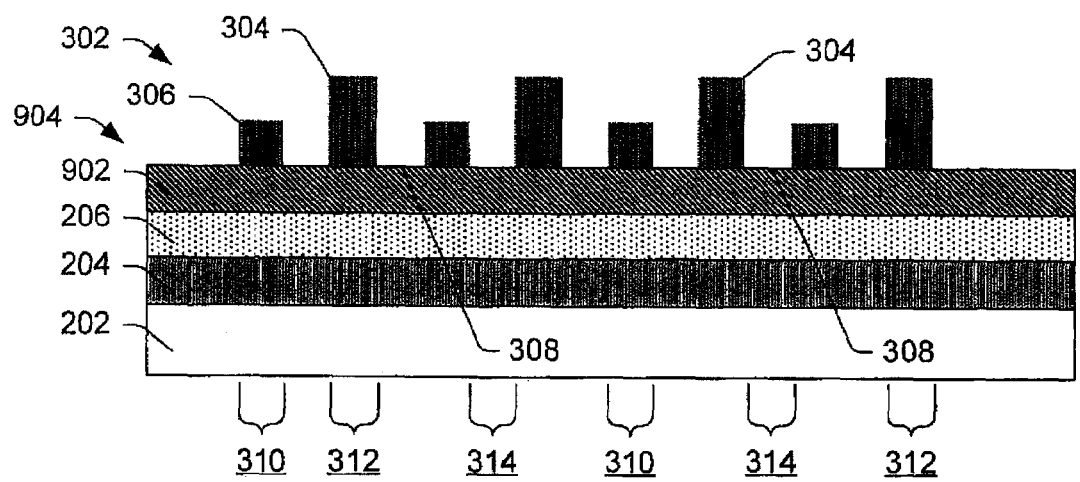
FIG. 10 includes the views of the substrate systems of FIG. 9 at a processing step subsequent to that shown in FIG. 9.
Figure 10:
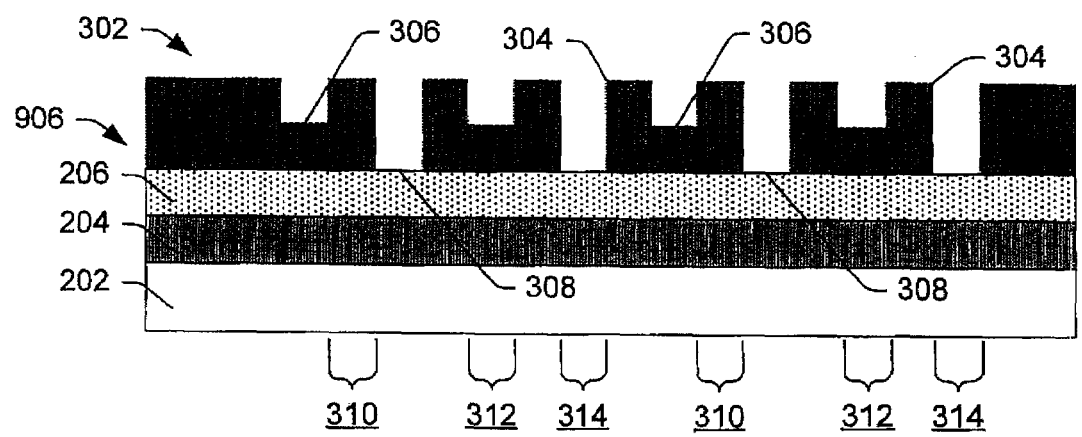

Referring to FIG. 10, examples of the elongate rows 302 are formed over the systems 904 and 906. These can be formed using one or more of the techniques set forth above. The elongate rows 302 formed over the system 904 can be formed by pressing the mold 908 over the system's 904 imprintable layer 210. Likewise, the elongate rows 302 formed over the system 906 can be formed by pressing the mold 910 over its imprintable layer 210.

In these embodiments, similar to the embodiments shown in FIG. 3, the rows 302 have an elongate dimension and a cross-section along that dimension having tiers of different thicknesses. In the illustrated example, the first tier 304, the second tier 306, and the third tier 308 are formed. Each of the tiers also defines the region beneath the tiers. In the illustrated example, the first region 310, the second region 312, and the third region 314 are respectively defined. The first tier 304 and the second tier 306 have thicknesses between about five to one hundred nanometers. In the illustrated example, the first tier 304 is about twenty to three hundred percent thicker than the second tier 306. The third tier 308 may have little or no thickness, such as from zero to five nanometers.

Each of a plurality of the rows 302 can have unique cross-sections. These rows 302 can be formed with one imprinting step with the mold 908 or 910 being a three-dimensional negative of the elongate rows 302. Forming the rows 302 can be performed as set forth in the description of FIG. 3, such as with very little alignment accuracy.

Processing the System without the Conductive Layer

Figure 11:
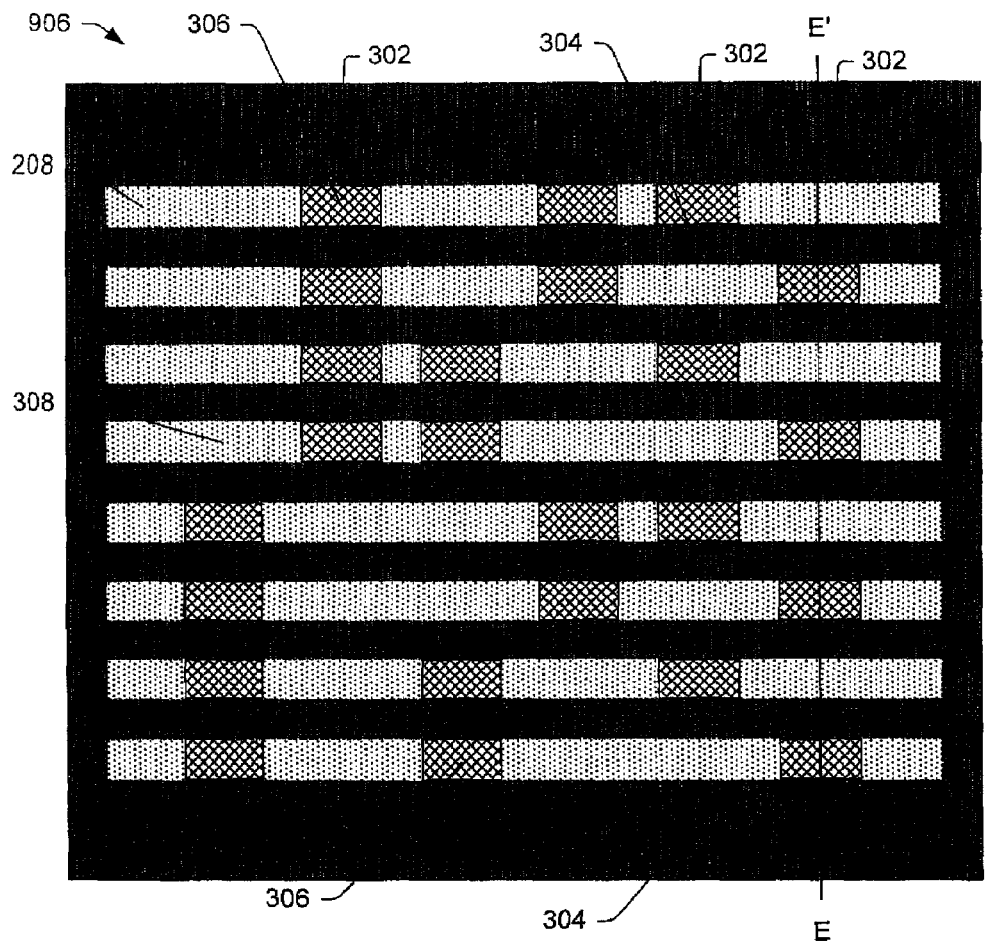
FIG. 11 includes the view of the second substrate system of FIG. 10 and a corresponding top-plan view, both views at a processing step subsequent to that shown in FIG. 10.
Figure 11:
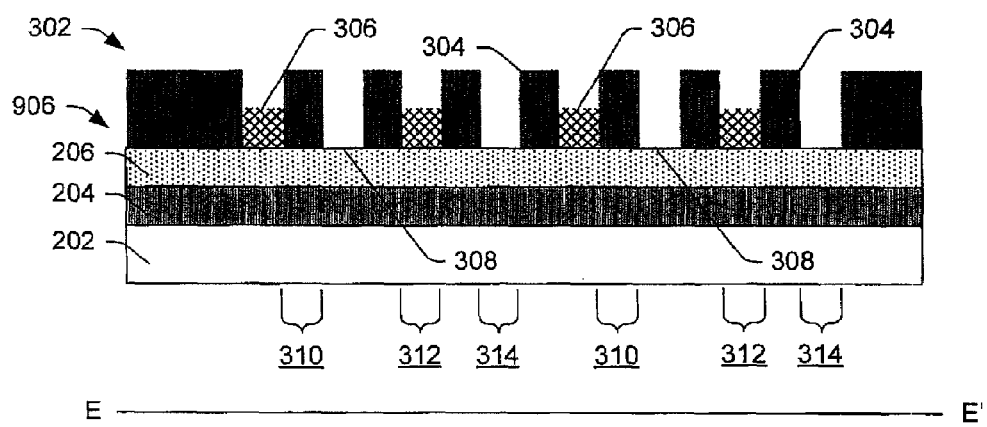

Referring to FIG. 11, a top-plan view of a plurality of the elongate rows 302 over the system 906 are shown. To aid the reader in visualizing the rows 302, the second tiers 306 are shown with a different fill-pattern than that shown in FIG. 10. The cross-section shown in FIG. 11 is along line E-E' of the top-plan view. The third tiers 308 have no material in this embodiment, making the semi-conductive layer 206 visible from the top-plan view at these tiers 308. In the ongoing embodiment, each of the elongate rows 302 have a unique cross-section.

Figure 12:
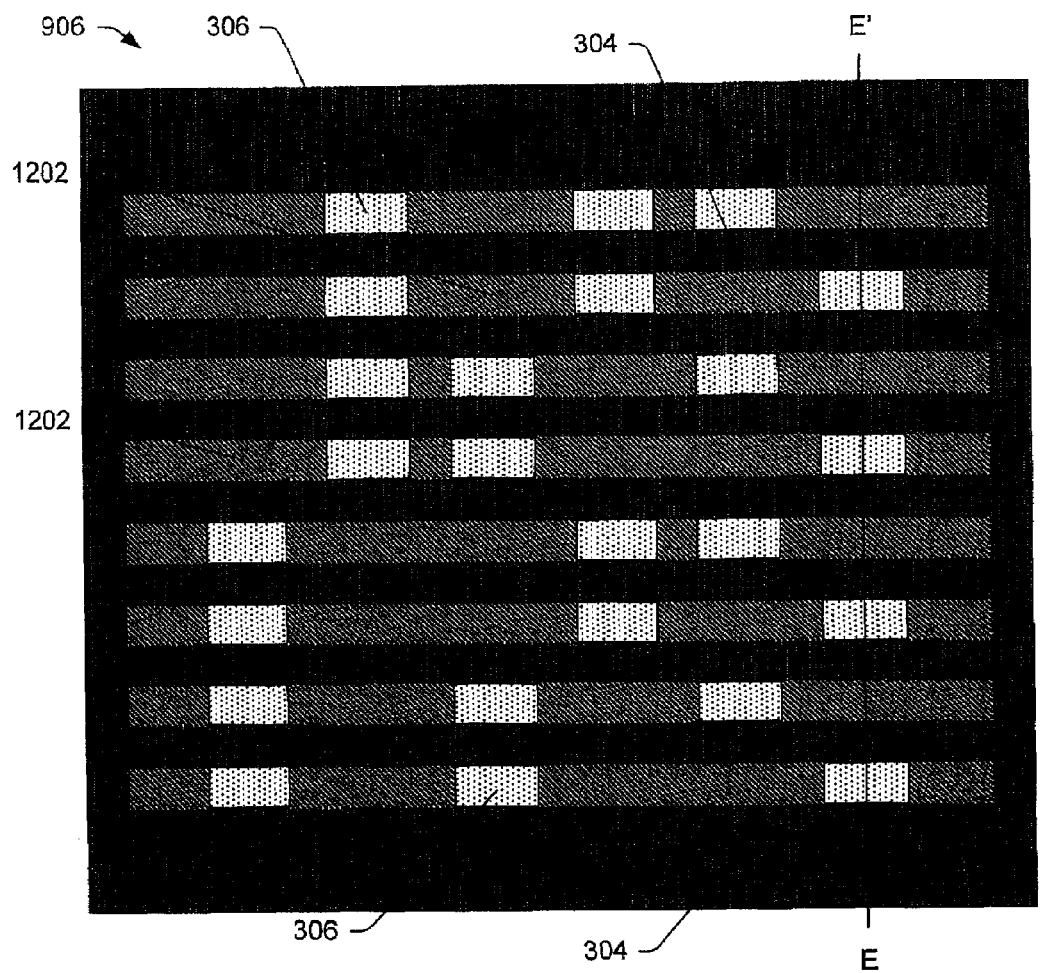
FIG. 12 includes the views of FIG. 11 at a processing step subsequent to that shown by FIG. 11.
Figure 12:
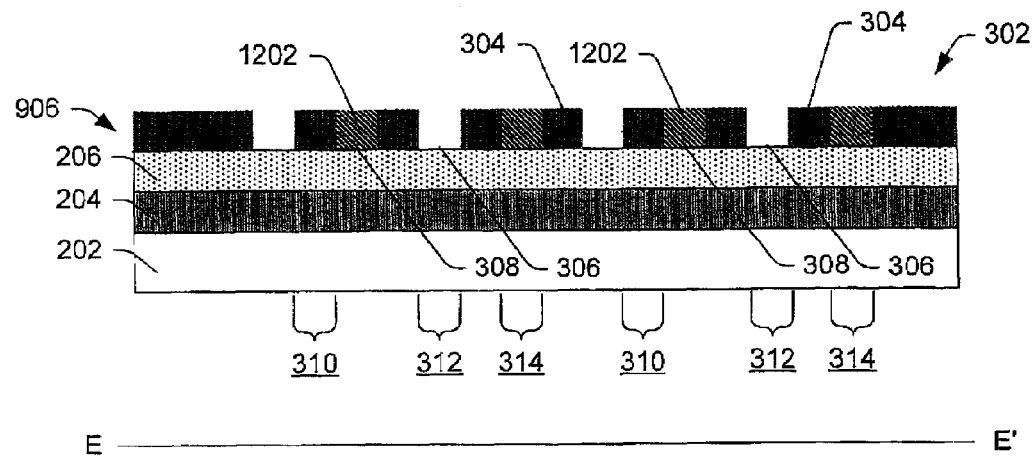

Referring to FIG. 12, highly conductive structures 1202 are formed over the regions 314 of the substrate 202 using electrolytic deposition or another suitable alignment-independent technique. These highly conductive structures 1202 are physically discontinuous at the second tiers 306.

Some of the thickness of the rows 302 is removed through time-etching or another suitable alignment-independent technique. In the ongoing embodiment, the first tiers 304 are made thinner and the second tiers 306 are removed, exposing some of the semi-conductive layer 206 in the second regions 312.

Figure 13:
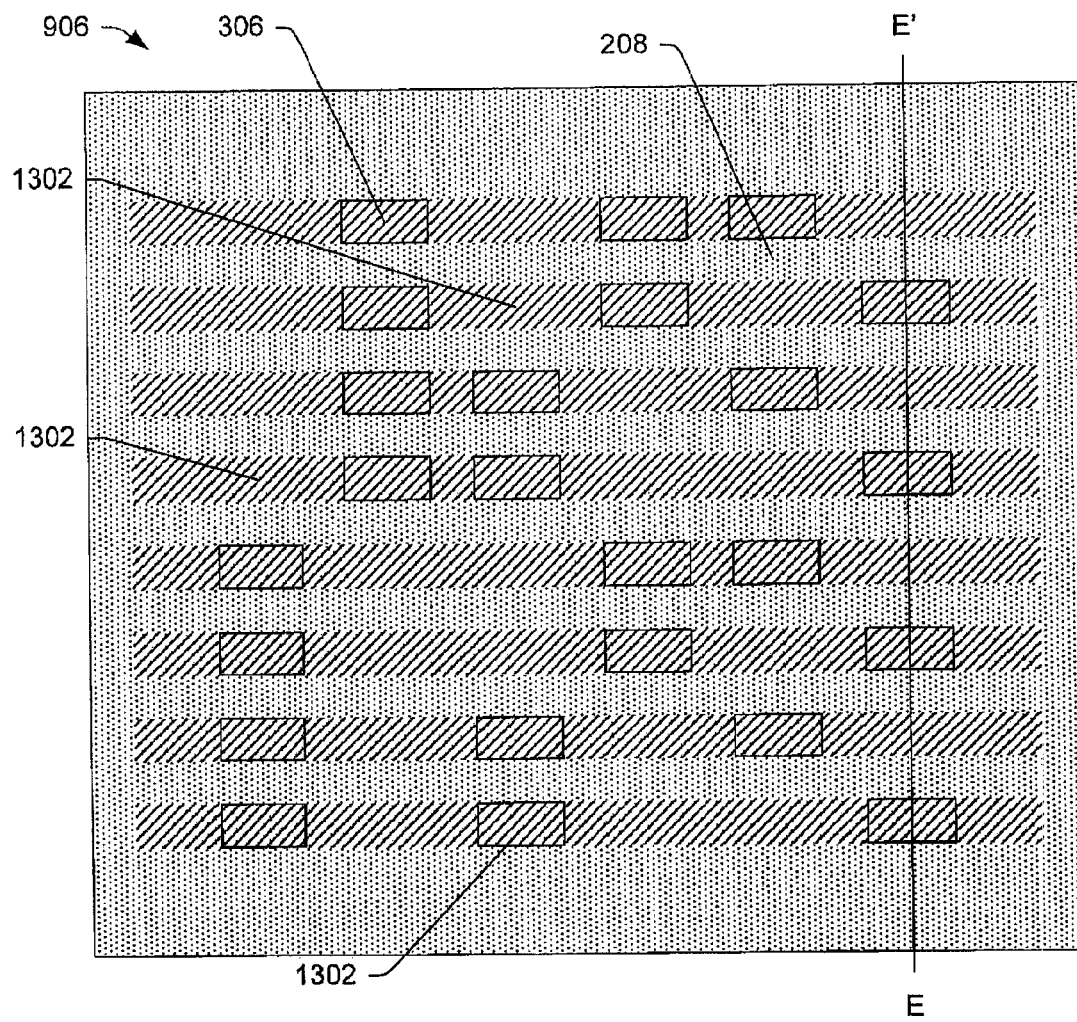
FIG. 13 includes the views of FIG. 12 at a processing step subsequent to that shown by FIG. 12.
Figure 13:
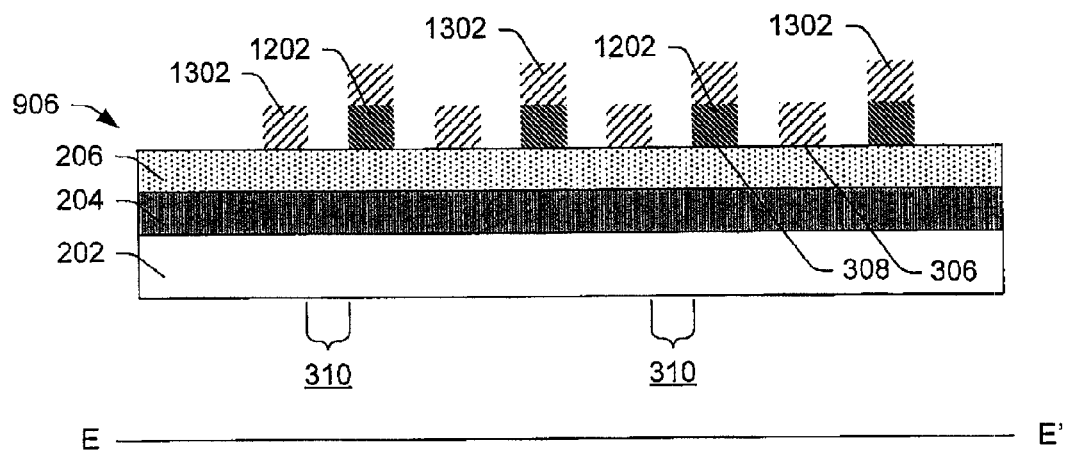

Referring to FIG. 13, removable structures 1302 are formed over the substrate 202 and over the regions 312 and 314 using electrolytic deposition or another suitable alignment-independent technique. In the ongoing embodiment, the removable structures 1302 comprise chromium.

The remainder of the elongate rows 302 is removed by time-etching or another suitable alignment-independent technique. By so doing, some of the semi-conductive layer 206 is exposed at the first regions 310.

Processing the System with the Highly Conductive Layer

Figure 14:
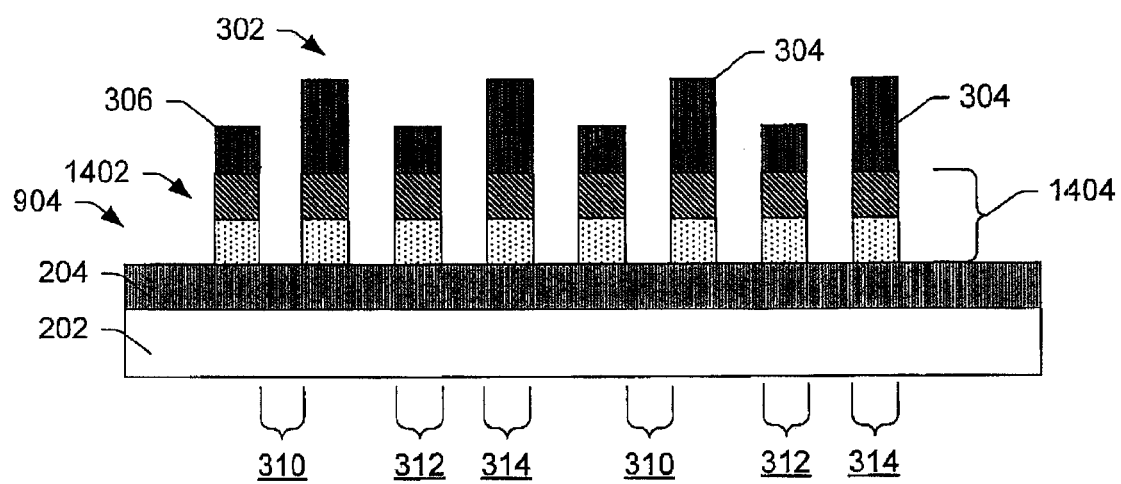
FIG. 14 includes the view of the first substrate system of FIG. 10 at a processing step subsequent to that shown in FIG. 10.

Referring to FIG. 14, the system 904 and the rows 302 (shown in FIG. 10) are processed to form an array 1402 of conductive-structure precursors 1404, either with etching or another suitable alignment-independent technique. In this embodiment, the array 1402 is formed by removing parts of the highly conductive layer 902 and the semi-conductive layer 206. The array 1402 is shown in cross-section perpendicular to an elongate dimension of the conductive structure precursors 1404 of the array 1402.

In this ongoing embodiment, the third regions 314 of the highly conductive layer 902 and the semi-conductive layer 206 are removed, while the first and second regions 310 and 312 are not removed because they are protected by the first and second tiers 304 and 306 of the rows 302.

Both Systems; with and without Conductive Layer

Figure 15:
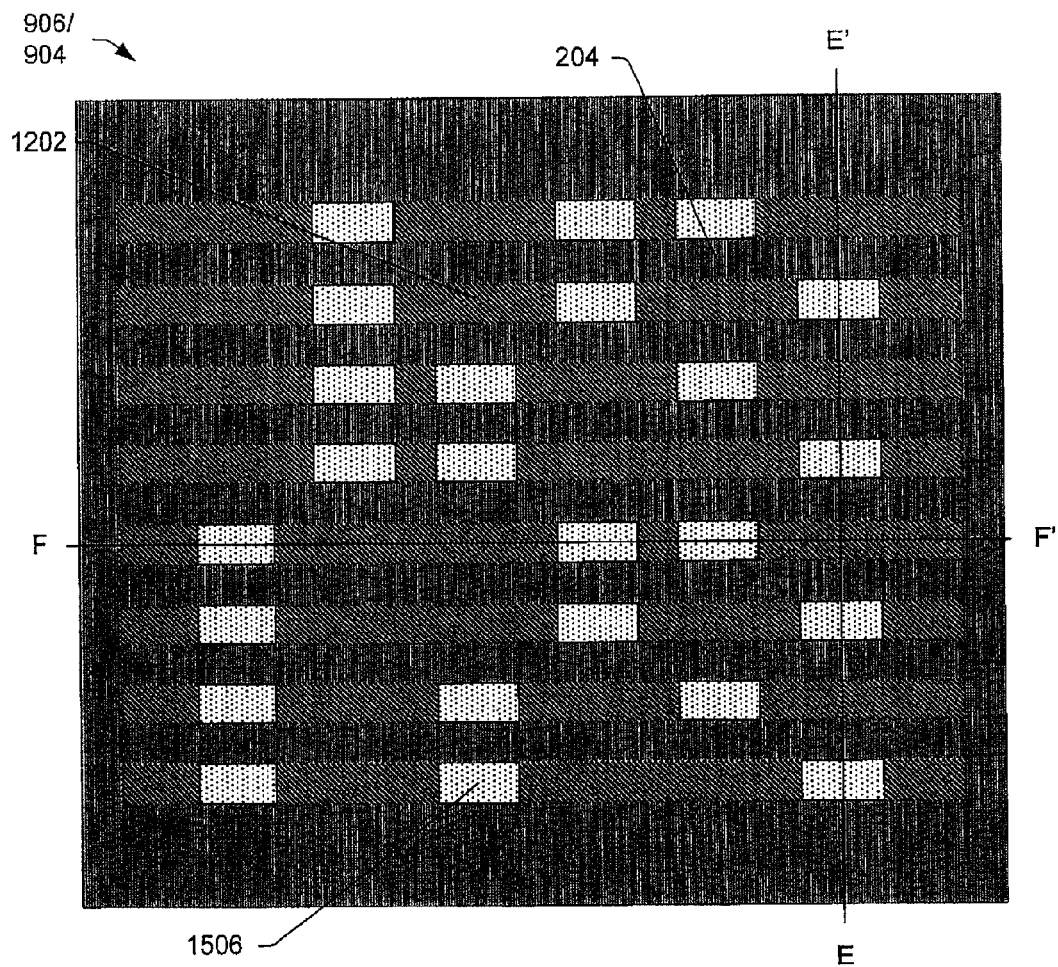
FIG. 15 includes the views of FIG. 13 at a processing step subsequent to that shown in FIG. 13 and the view of FIG. 14 at a processing step subsequent to that shown in FIG. 14.
Figure 15:
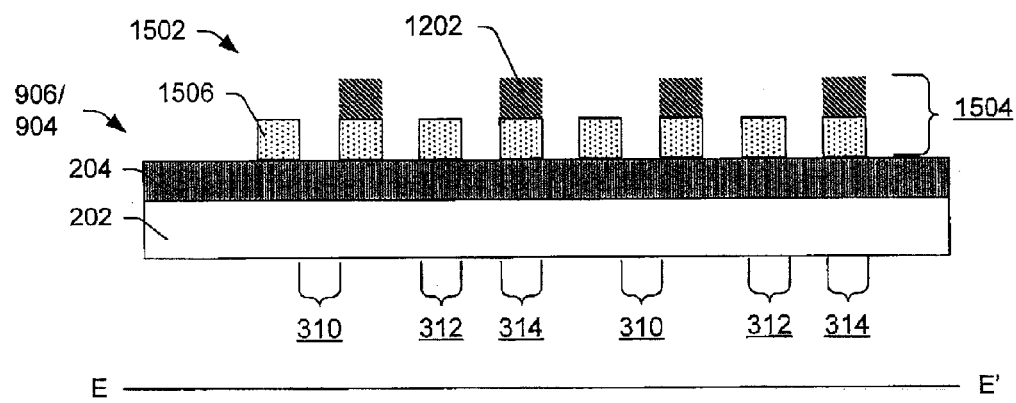

Referring to FIG. 15, an array 1502 of conductive structures 1504 are formed through etching or other suitable alignment-independent technique(s).

Figure 16:
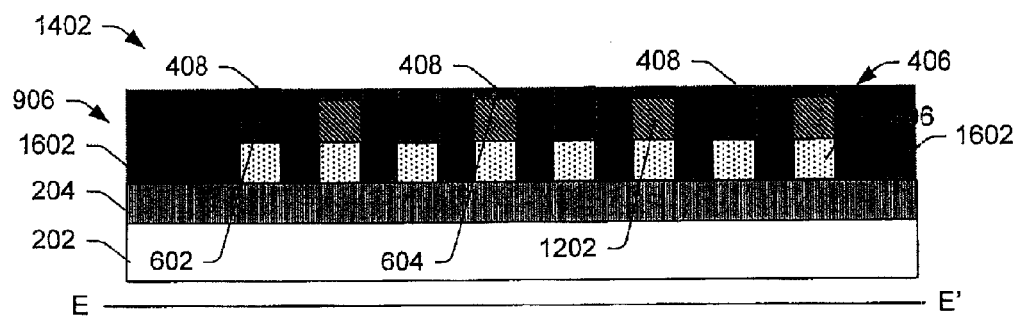
FIG. 16 includes the cross-section of FIG. 15 and another corresponding cross-section, both at a processing step subsequent to that shown in FIG. 15.
Figure 16:
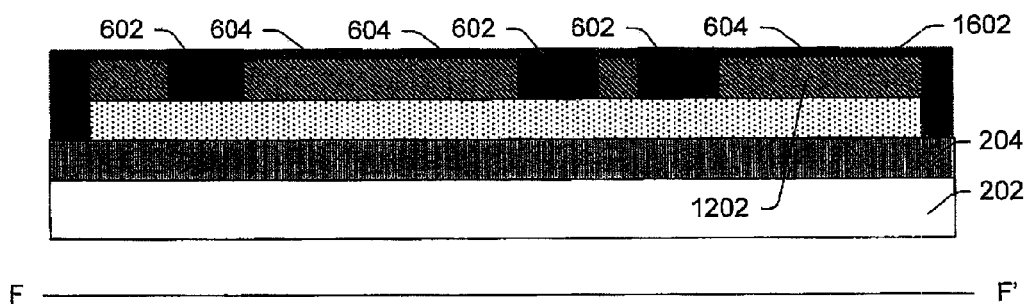

In the embodiment using the system 906 of FIG. 13, the semi-conductive layer 206 at the first regions 310 are removed by etching or another suitable alignment-independent technique. The semi-conductive layer 206 at the second and third regions are protected from the removal process by the removable structures 1302. Either as part of the formation of the conductive structures 1504 or following the formation, the removable structures 1302 are also removed. A cross-section along one of the conductive structures 1504 (Line F-F') is shown in FIG. 16.

In the embodiment using the system 904 of FIG. 14, the array 1502 of the conductive structures 1504 is formed through one or more etching processes or other suitable alignment-independent technique(s). Portions of the conductive structure precursors 1404 (of FIG. 14) can be removed by time-etching the rows 302 to remove the second tiers 306, etching away the second regions 312 of highly conductive material of the conductive structure precursors 1404, and etching away the remaining material of the rows 302, for instance.

In the ongoing embodiment using the system 904, the conductive structures 1504 comprise the highly conductive structures 1202 (though here formed from the conductive structure precursors 1404) and the semi-conductive structures 1506 (also of the conductive structure precursors 1404). The semi-conductive structures 1506 comprise material from the semi-conductive layer 206.

In the ongoing embodiment using the system 906, the conductive structures 1504 comprise the highly conductive structures 1202 and the semi-conductive structures 1506.

Thus, using different alignment-independent techniques, both of the systems 904 and 906 can be processed into the embodiment shown in FIG. 15.

Referring to FIG. 16, an example of the array 406 of the dielectric structures 408 is formed from the embodiment shown in FIG. 15 by forming a layer of dielectric material over the conductive structures 1504, such as by physical vapor deposition or other suitable alignment-independent technique(s). Certain of the dielectric structures 408 are not capable of acting as gates for a FET because of their proximity to the highly conductive structures (these are marked as the non-gates 604). Others of the dielectric structures 408 (shown as the gates 602) are formed capable of acting as gates for FETs. These gates 602 are in electrical communication with the semi-conductive portion of the conductive structures 1504 (here the semi-conductive structures 1506).

Addressing the FET Gates of Both Systems

Figure 17:
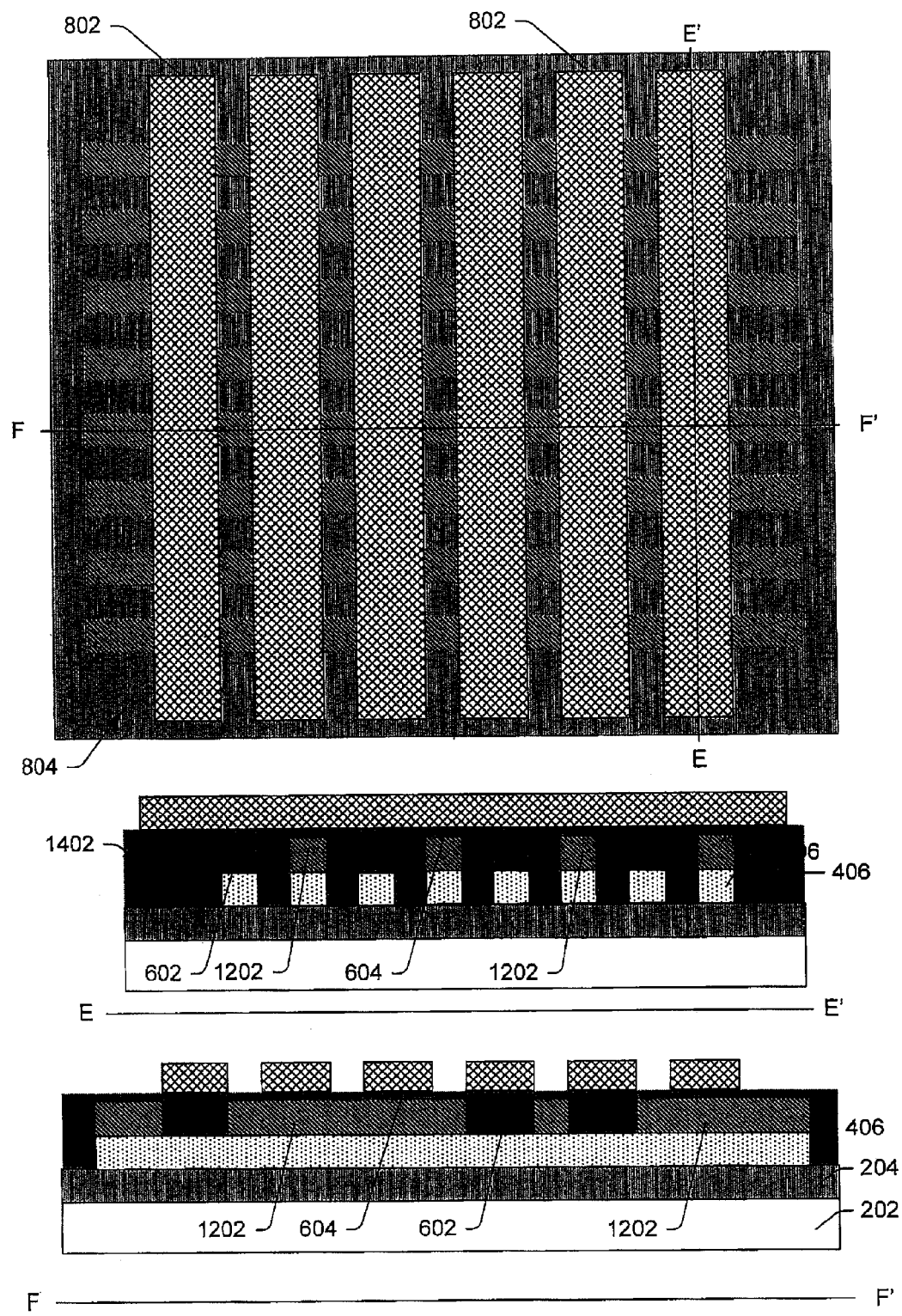
FIG. 17 includes the views of FIG. 16 and a corresponding top-plan view, all at a processing step subsequent to that shown in FIG. 16.

Referring to FIG. 17, an example of the address lines 802 are formed over the gates 602 similar to those set forth in the description of FIG. 8 above. The gates 602 act as FETs for the mux/demux architecture 804 shown in FIG. 17. The non-gates 604 do not acts as FETs because they are in electrical proximity with the highly conductive structures 1202. As shown with the cross-section along line F-F', the conductive structure 1504 of this embodiment enables high-conductivity at regions other than regions in which the gates 602 of the mux/demux architecture 804 reside.

Although the invention is described in language specific to structural features and methodological steps, it is to be understood that the invention defined in the appended claims is not necessarily limited to the specific features or steps described. Rather, the specific features and steps disclosed represent exemplary forms of implementing the claimed invention.

What is claimed is:

1. A system comprising:
    an array of conductive structures having a pitch from about one to about ninety nanometers; and
    a multiplexing/demultiplexing architecture having address lines and address field-effect transistors (FETs), the address lines in electrical communication with the conductive structures through the address FETs.

2. The system of claim 1, wherin the conductive structures comprise highly conductive and semi-conductive regions.

3. The system of claim 2, further comprises an array of dielectric structures in physical proximity to the highly conductive regions and the semi-conductive regions, wherein the dielectric structures in physical proximity to the semi-conductive regions are capable of acting as gates for the address FETs.

4. The system of claim 1, further comprises an array of dielectric structures, the dielectric structures having thin regions and thick regions, the thin regions capable of acting as gates for the address FETs.

5. A system comprising:
    an array of conductive structures:
    an array of dielectric structures having thick and thin regions in proximity with the conductive structures: and
    a multiplexing/demultiplexing architecture having address lines in proximity with the dielectric structures, the address lines and the thick or thin regions forming field-effect transistors (FETs) enabling electrical communication between the address lines and the conductive structures.

6. The system of claim 5, wherein the array of conductive structures has a pitch of less than or about ninety nanometers.

7. The system of claim 5, wherein the conductive structures each comprise highly conductive and semi-conductive regions.

8. The system of claim 7, wherein the thick regions of the dielectric structures are in physical proximity with the semi-conductive regions and form the FETs.

9. The system of claim 5, wherein the thick and thin regions of the dielectric structures have substantially a same width as the conductive structures with which each is in proximity.

* * * * *

UNITED STATES PATENT AND TRADEMARK OFFICE
CERTIFICATE OF CORRECTION

| | | |
|---|---|---|
| PATENT NO. | : 7,633,098 B2 | Page 1 of 1 |
| APPLICATION NO. | : 11/765374 | |
| DATED | : December 15, 2009 | |
| INVENTOR(S) | : Xiaofeng Yang et al. | |

It is certified that error appears in the above-identified patent and that said Letters Patent is hereby corrected as shown below:

On the Title page, in field (75), Inventors, in column 1, line 2, delete "Komilovich" and insert -- Kornilovich --, therefor.

In column 8, line 49, in Claim 2, delete "wherin" and insert -- wherein --, therefor.

In column 8, line 62, in Claim 5, delete "structures:" and insert -- structures; --, therefor.

In column 8, line 64, in Claim 5, delete "structures:" and insert -- structures; --, therefor.

Signed and Sealed this

Eleventh Day of May, 2010

David J. Kappos
*Director of the United States Patent and Trademark Office*